(12) United States Patent
Zhuang et al.

(10) Patent No.: US 6,579,793 B2
(45) Date of Patent: Jun. 17, 2003

(54) METHOD OF ACHIEVING HIGH ADHESION OF CVD COPPER THIN FILMS ON TAN SUBSTRATES

(75) Inventors: Wei-Wei Zhuang, Vancouver, WA (US); Wei Pan, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/820,224

(22) Filed: Mar. 27, 2001

(65) Prior Publication Data

US 2002/0139446 A1 Oct. 3, 2002

(51) Int. Cl.[7] .............................................. C23C 16/18
(52) U.S. Cl. .......................... 438/681; 438/687; 427/99; 427/252; 427/255.23; 427/376.7; 427/383.3
(58) Field of Search ...................... 427/99, 252, 255.23, 427/376.7, 383.3; 438/681, 687

(56) References Cited

U.S. PATENT DOCUMENTS

| | | |
|---|---|---|
| 4,385,005 A | 5/1983 | Doyle |
| 4,425,281 A | 1/1984 | Doyle |
| 5,085,731 A | 2/1992 | Northan et al. |
| 5,096,737 A | 3/1992 | Baum et al. |
| 5,744,192 A * | 4/1998 | Nguyen et al. ............. 427/250 |
| 5,994,571 A | 11/1999 | Zhuang et al. |
| 6,015,918 A | 1/2000 | Zhuang et al. |
| 6,319,728 B1 * | 11/2001 | Bhan et al. ................ 438/680 |
| 6,355,562 B1 * | 3/2002 | Charneski et al. .......... 438/622 |

OTHER PUBLICATIONS

Yang et al., J. Vac. Sci. Technol. B 20(2), Mar./Apr. 2002, pp. 495–506.*
Doyle, G., Alkene and Carbon Monoxide Derivatives of Copper (I) and Silver (I) β–Diketonates,, Organometallics 1985, 4, 830–835.
Beach, David B., Low–Temperature Chemical Vapor Deposition of High–Purity Copper from an Organometallic Source, Chem. Mater., 1990, 2, 216–219.
Hampden–Smith, M.J., Chemical Vapor Deposition of Copper from Copper (I) Trimethylphosphine Compounds, Chem. Mater. 1990, 2, 636–639.

* cited by examiner

Primary Examiner—Timothy Meeks
(74) Attorney, Agent, or Firm—David C. Ripma; Matthew D. Rabdau; Scott C. Krieger

(57) ABSTRACT

A fabrication process provides for achieving high adhesion of CVD copper thin films on metal nitride substrates, and in particular, on substrates having an outermost TaN layer. The method comprises introducing a certain amount of water vapor to the initial copper thin film deposition stage and reducing the amount of fluorine in the interface of the copper and metal nitride substrate. These two process steps result in a copper thin film having improved adhesion to metal nitride substrates, including TaN substrates.

21 Claims, 1 Drawing Sheet

METHOD OF ACHIEVING HIGH ADHESION OF CVD COPPER THIN FILMS ON TAN SUBSTRATES

FIELD OF THE INVENTION

This invention relates to a chemical vapor deposition process in integrated circuit fabrication and, more particularly, to a method of achieving high adhesion of CVD copper thin films on Tantalum Nitride (TaN) substrates.

BACKGROUND OF THE INVENTION

The demand for progressively small, less expensive, and more powerful electronic products has fueled the need for smaller geometry integrated circuits (ICs) on large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the area of the interconnecting surfaces is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conducts having highly different impedance characteristics.

There is a need for interconnects and vias to have both low resistivity, and the ability to withstand process environments of volatile ingredients. Aluminum and tungsten metals are often used in the production of integrated circuits for making interconnections or vias between electrically active areas. These metals are popular because they are easy to use in a production environment, unlike copper which requires special handling.

However, due to its unique properties, copper (Cu) appears to be a natural choice to replace aluminum in the effort to reduce the size of lines and vias in an electrical circuit. The conductivity of copper is approximately twice that of aluminum and over three times that of tungsten. As a result, the same current can be carried through a copper line having nearly half the width of an aluminum line. The electromigration characteristics of copper are also much superior to those of aluminum. Aluminum is approximately ten times more susceptible than copper to degradation and breakage due to electromigration. As a result, a copper line, even one having a much smaller cross-section than an aluminum line, is better able to maintain electrical integrity. Accordingly, due to Copper's low resistivity (1.7 $\mu\Omega\cdot cm$) and high electromigration resistance, copper metal thin films are considered the ideal material for successful future use as metal interconnections in integrated circuit devices.

There have been problems associated with the use of copper, however, in integrated circuit processing. Copper interconnect lines generally are formed by depositing copper onto either dual damascene or single damascene trenches lined with a barrier metal, typically in the form of a metal nitride such as titanium nitride or tantalum nitride, followed by a chemical mechanical polishing (CMP) process. The deposition methods include plasma enhanced chemical vapor deposition (PECVD), metal organic chemical vapor deposition (MOCVD), and electrochemical deposition (ECD) processes. ECD requires a copper seed layer, which is either deposited by PECVD or by MOCVD. Copper deposited by PECVD exhibits poor step coverage. Accordingly, the process is not suitable for very narrow trench applications.

MOCVD appears to be the ideal process for the deposition of copper into sub-micron trenches and vias. MOCVD also appears to be the ideal process for providing copper seed for ECD trench/via filling. The problem, however, is that the state-of-the-art MOCVD process does not yield good adhesion between the copper and the barrier metal. The current solutions to this problem include using a flash PECVD process to provide a very thin seed for the seed CVD copper, or adding a small amount of silicon to the top of the barrier metal nitride compound. These solutions increase the process complexity and/or increase the barrier metal to copper contact resistance.

Modification of the copper precursor is another option to improve the adhesion of the copper thin film. In one example, CupraSelect Blend (Registered trademark of Schumacher company) was introduced to replace pure CupraSelect (Registered trademark of Schumacher company) by the addition of a very small amount of dihydride hexafluoroacetylacetone (H(hfac).$2H_2O$). By using CupraSelect Blend and a copper precursor, the adhesion of copper thin films on a TiN substrate is improved. However, use of the CupraSelect Blend does not solve the adhesion problems associated with deposition of copper thin films on TaN substrates.

SUMMARY OF THE INVENTION

The method of the present invention provides a fabrication process for achieving high adhesion of CVD copper thin films on metal nitride substrates, and in particular, on Tantalum Nitride (TaN) substrates. The method comprises introducing a certain amount of water vapor to the initial copper thin film deposition stage and reducing the amount of fluorine in the interface of the copper and metal nitride substrate. These two process steps result in a copper thin film having improved adhesion to metal nitride substrates, including TaN substrates.

Accordingly, an object of the present invention is to provide a method of producing copper thin films having high adhesion to metal nitride substrates.

Another object of the present invention is to provide a method of producing copper thin films having high adhesion to TaN substrates.

Still another object of the present invention is to provide a method of introducing a certain amount of water vapor to an initial copper thin film deposition stage so as to produce a thin copper film having increased adhesion to TaN substrates.

Yet another object of the present invention is to provide a method of reducing the amount of fluorine in an interface so as to produce a thin copper film having increased adhesion to TaN substrates.

DETAILED DESCRIPTION OF THE PREFERRED EMBODIMENTS

Figure 1:
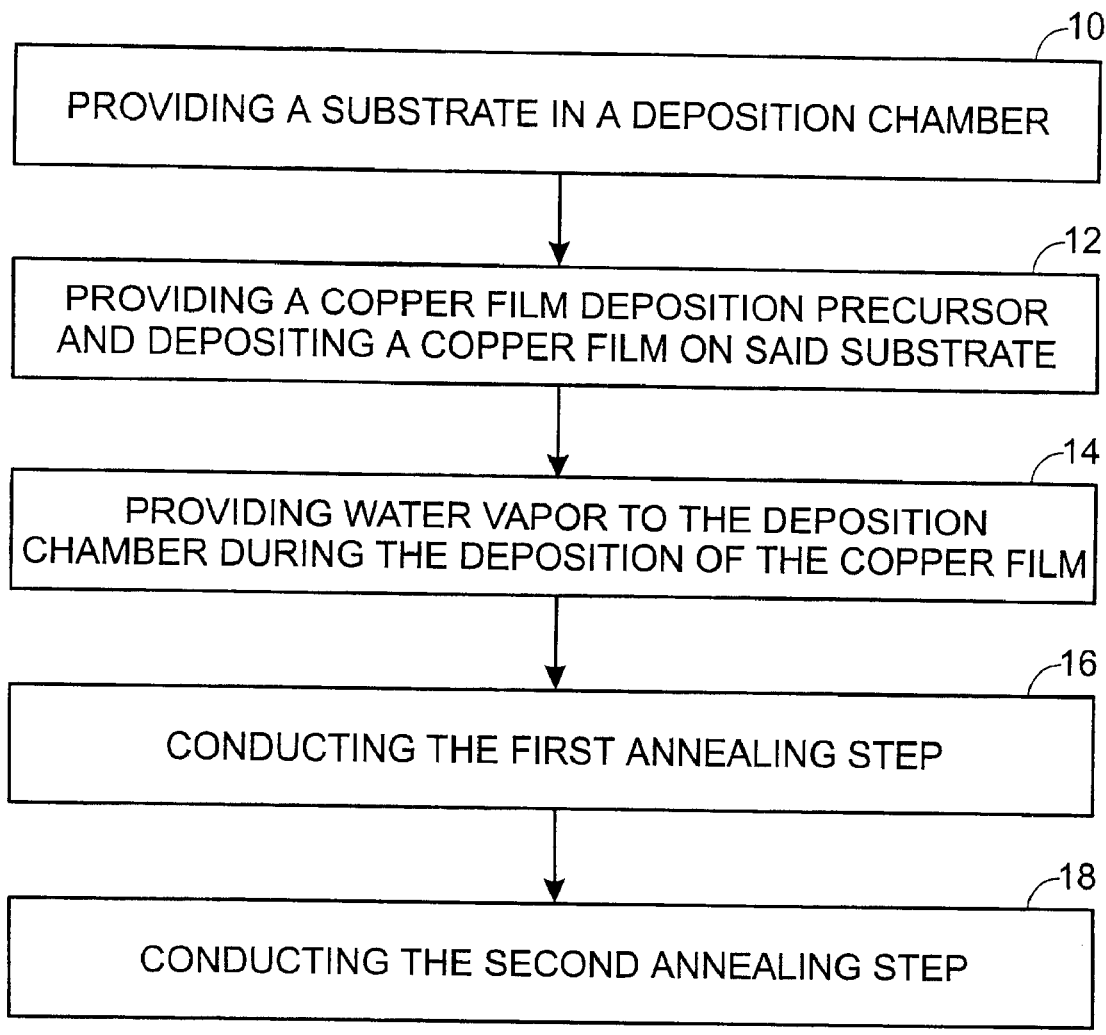
FIG. 1 is flowchart of the process of the present invention.

The adhesion of chemical vapor deposition (CVD) copper thin films to metal nitride substrates, such as Titanium Nitride, Tantalum Nitride and Silicon Nitride, depends on the formation of a copper nuclei layer in the initial copper thin film deposition stage. Applicants' experimental results show two process steps that each result in improved adhesion of copper thin films to metal nitride substrates. The first process step comprises using water vapor in the initial copper thin film deposition stage to improve adhesion of the copper thin film to the metal nitride substrate. The second process step comprises reducing the fluorine content in the interface of the copper thin film to improve the adhesion characteristics of the copper thin film. Reducing the amount of fluorine in the interface is accomplished by conducting a two stage annealing process on the copper thin film. Applicants have incorporated these two process steps into the inventive CVD fabrication process to improve the adhesion of copper thin films on metal nitride substrates, such as TaN substrates. The experimental results are set forth below.

As a first step of the inventive process, water vapor is added to the CVD chamber during the initial deposition step of the copper thin film. Water, being a strong, polar liquid, is believed to attack the copper center and result in the decomposition of hexafluoroacetylacetone copper ligand ((hfac)CuL), where L typically is an organic ligand. The decomposition products of (hfac)CuL are copper metal as the copper thin film, the ligand as a volatile organic solvent which is pumped out of the deposition chamber, and Cu(hfac)2 as a volatile compound which also may be pumped out of the deposition chamber. Because the copper deposition is carried out in a reduction atmosphere, the Cu(hfac)2 may be reduced to copper metal and a (hfac) ligand, which in turn may be absorbed on the substrate surface. Thus, water can be easily coordinated to the copper center of the Cu(hfac)2 hydrate compound, which is more volatile that Cu(hfac)2. Accordingly, the added water vapor helps to remove the Cu(hfac)2, and decreases the (hfac) amount absorbed on the substrate surface. The more (hfac) that is absorbed on the surface, the poorer the adhesion of the copper thin film thereto. Addition of the water vapor, therefore, helps to increase the adhesion of the copper thin film to the metal nitride surface.

The deposition process of the present invention typically may be carried out with temperatures, pressures and precursors known in the art. The carrier gas used typically is Helium, which is bubbled through a water bath to add the additional water vapor to the deposition chamber. The process is most easily carried out at room or ambient temperature with a water vapor pressure of approximately 50 torr, and typically in a range of 40 to 80 torr. The flow rate of the wet helium typically is in a range of 5 to 20 sccm.

After this initial deposition step, wherein water vapor is added to the deposition chamber, the copper thin film that has been deposited is then subjected to a fluorine reduction step. Fluorine is believed to reduce the adhesion properties of a copper film to a metal nitride substrate. In particular, copper thin films deposited via physical vapor deposition using pure copper metal as the target source showed extremely good adhesion to a metal nitride substrate. In the chemical vapor deposition process, a secondary ion mass spectrometry (SIMS) analysis indicated a high fluorine concentration on the copper thin film and metal nitride interface. This high fluorine concentration is believed to be the source of the poor adhesion characteristics. Accordingly, Applicants have developed the following process to reduce the fluorine concentration at the copper thin film and metal nitride interface.

To reduce the fluorine amount in the interface of the copper thin film, the thin film is subjected to an annealing process under high vacuum. The fluorine content of the thin film is believed to be reduced by two different means: first, fluorine is removed from the copper thin film due to the volatility of fluorine and, second, Applicants believe, fluorine is removed from the copper thin film due to the formation of $TaF_5$. The fluorine content present in the deposition chamber results from the decomposition of (hfac)CuL. The $TaF_5$ content present in the deposition chamber is believed to result from a reaction of the fluorine with the tantalum metal to form $TaF_5$.

The formation of $TaF_5$ presents several process considerations. In particular, Applicants have found that a high temperature is needed for the formation of $TaF_5$. Additionally, the process of pumping out the newly formed $TaF_5$ is more difficult that pumping out fluorine from the reactant vessel. Moreover, stress is created at the interface of the copper and the metal nitride interface due to the different thermal coefficients of the two layers, i.e., different thermal coefficients of the metal nitride layer and the copper layer.

Taking these considerations into account, Applicants have discovered that a two step annealing treatment will result in removal of the fluorine and the formed $TaF_5$, and will result, therefore, in a high adhesion copper thin film on the metal nitride substrate. In the first step of the annealing process, the copper thin film is annealed at a low temperature so as to pump out most of the fluorine in the thin film interface. The first step of the annealing process typically takes place at a temperature in a range of 300 to 350° C. No annealing gas is used, i.e., the reactant chamber is merely heated and pressurized at a high vacuum pressure without the addition of a gas. In particular, the first annealing step typically is conducted at a pressure equal to or less than $1.0 \times 10^{-7}$ torr. In the second annealing step, the copper thin film is annealed at a higher temperature to pump out any possibly formed $TaF_5$. The second step of the annealing process typically takes place at a temperature in a range of 350 to 450° C. The pressure of the second annealing step typically is also equal to or less than $1.0 \times 10^{-7}$ torr. These annealing steps are believed to remove fluorine and $TaF_5$ from the copper thin film and result in a film having good adhesion properties. In particular, the resulting copper thin film on a TaN substrate will withstand standard tape and peel tests.

The disclosed process may also be used to form copper thin films with good adhesion properties on other metal nitrides such as TiN and SiN. However, other available methods are known in the art for producing such structures. Accordingly, the method of the present invention is believed to be most useful for the deposition of a copper thin film on tantalum nitride substrates.

FIG. 1 shows a flowchart of the process of the present invention. Step 10 comprises providing a substrate in a deposition chamber. The substrate typically comprises a silicon based substrate as known in the art of semiconductor fabrication, having a metal nitride layer thereon. The metal nitride layer is the outermost layer of the substrate and is adapted for the deposition of a thin copper thin film thereon. The metal nitride layer may comprise TaN, TiN and SiN. Step 12 comprises providing a deposition precursor such as hexafluoroacetylacetone Copper Ligand (hfac)CuL and depositing a thin copper film on the metal nitrate layer on the substrate. Step 14 comprises adding water vapor to the deposition chamber during the stage of the copper film deposition process. The water vapor typically is introduced to the deposition chamber by bubbling a carrier gas such as Helium through a water bath. The water vapor pressure in the deposition chamber typically is approximately 50 torr, and generally is in a range of 40 to 80 torr. Step 16 comprises the first annealing step. The first annealing step comprises subjecting the thin copper film deposited on the substrate to a temperature in a range of 300 to 350° C. for a time period in a range of 10 to 30 minutes. No annealing gas is used, i.e., the reactant chamber is merely heated and pressurized at a high vacuum pressure. In particular, the first annealing step typically is conducted at a pressure equal to or less than $10\times10^{-7}$ torr. This first annealing step removes fluorine from the interface of the copper thin film and the metal nitride. Step 18 comprises the second annealing step. The second annealing step comprises subjecting the deposited thin copper film on the substrate to a temperature in a range of 350 to 450° C. for a time period in a range of 10 to 30 minutes. The pressure of the second annealing step typically is also equal to or less than $1.0\times10^{-7}$ torr. The second annealing step removes $TaF_5$ from the deposition chamber, which results in good adhesion characteristics of the deposited copper thin film.

Thus, a method of achieving improved adhesion between copper thin films and metal nitride substrates, such as TaN, in integrated circuits has been disclosed. Although preferred structures and methods of fabricating the copper thin films have been disclosed, it should be appreciated that further variations and modifications may be made thereto without departing from the scope of the invention as defined in the appended claims.

What is claimed is:

1. A process of fabricating an integrated circuit comprising:
   providing in a deposition chamber a substrate having a metal nitride layer;
   providing a copper precursor to said deposition chamber, wherein said copper precursor comprises (hfac)CuL;
   reacting said copper precursor so as to deposit by chemical vapor deposition a thin copper film on said metal nitride layer, wherein said reaction produces by-products including a ligand and Cu(hfac)2;
   introducing a water vapor to said deposition chamber during said step of reacting said copper precursor so as to facilitate coordination of said water vapor to said Cu(hfac)2 by-product; and
   annealing said thin copper film at a pressure of $1\times10^{-7}$ torr or less.

2. The process of claim 1 wherein said water vapor introduced has a water vapor pressure in a range of 40 to 80 torr.

3. The process of claim 1 wherein said metal nitride layer comprises tantalum nitride.

4. The process of claim 1 further comprising annealing said thin copper film at a temperature in a range of 300 to 350° C. for a time period in a range of 10 to 30 minutes.

5. The process of claim 1 further comprising annealing said thin copper film at a temperature in a range of 350 to 450° C. for a time period in a range of 10 to 30 minutes.

6. The process of claim 1 wherein said water vapor is introduced to said deposition chamber by bubbling helium through water.

7. The process of claim 1 wherein said step of annealing said thin copper film at a pressure of $1\times10^{-7}$ torr or less is conducted in said deposition chamber without the addition of a reducing agent to the deposition chamber.

8. A method of achieving good adhesion of a chemical vapor deposition copper thin film on a tantalum nitride substrate comprising:
   providing in a deposition chamber a substrate having a tantalum nitride layer;
   providing a copper precursor to said deposition chamber, wherein said copper precursor comprises (hfac)CuL;
   reacting said copper precursor so as to deposit by chemical vapor deposition a thin copper film on said tantalum nitride layer, wherein said reaction produces by-products including Cu(hfac)2; and
   annealing said thin copper film at a temperature in a range of 300 to 350° C. for a time period in a range of 10 to 30 minutes and at a pressure of $1\times10^{-7}$ torr or less.

9. A The method of claim 8 further comprising introducing a water vapor to said deposition chamber during said step of reacting said copper precursor so as to facilitate coordination of said water vapor to said Cu(hfac)2 by-product.

10. The method of claim 9 wherein said water vapor introduced has a water vapor pressure in a range of 40 to 60 torr.

11. The method of claim 9 wherein said water vapor is introduced to said deposition chamber by bubbling helium through water wherein the flow rate of the helium is in a range of 5 to 20 sccm.

12. The method of claim 8 further comprising a second annealing step, wherein said second annealing step comprises annealing said thin copper film at a temperature in a range of 350 to 450° C. for a time period in a range of 10 to 30 minutes.

13. The method of claim 12 wherein said second annealing step is conducted at a pressure of $1\times10^{-7}$ torr or less.

14. The method of claim 12 wherein said second annealing step results in the production of $TaF_5$, the method further comprising removing said $TaF_5$ from said deposition chamber.

15. The method of claim 8 wherein said step of annealing said thin copper film at a temperature in a range of 300 to 350° C. for a time period in a range of 10 to 30 minutes and at a pressure of $1\times10^{-7}$ torr or less is conducted in said deposition chamber without the addition of a gas to said deposition chamber.

16. A process of fabricating an integrated circuit having a copper thin film deposited on a metal nitride, comprising:
   providing in a deposition chamber a substrate having a metal nitride layer;
   providing a copper precursor to said deposition chamber, wherein said copper precursor comprises (hfac)CuL;
   reacting said copper precursor so as to deposit by chemical vapor deposition a thin copper film on said metal nitride layer, wherein said reaction produces by-products including Cu(hfac)2;
   introducing a water vapor to said deposition chamber during said step of reacting said copper precursor so as to facilitate coordination of said water vapor to said Cu(hfac)2 by-product;
   without adding an annealing gas to the deposition chamber, annealing said thin copper film in the deposition chamber at a temperature in a range of 300 to 350° C. for a time period in a range of 10 to 30 minutes; and
   annealing said thin copper film at a temperature in a range of 350 to 450° C. for a time period in a range of 10 to 30 minutes.

17. The process of claim 16 wherein said water vapor introduced has a water vapor pressure in a range of 40 to 80 torr, and wherein the water vapor is introduced to the deposition chamber by bubbling helium through water at a flow rate in a range of 5 to 20 sccm.

18. The process of claim 16 wherein said metal nitride is chosen from the group consisting of tantalum nitride and silicon nitride.

19. The process of claim 16 wherein both steps of annealing said thin copper film are each conducted at a pressure of $1\times10^{-7}$ torr or less.

20. The process of claim 16 wherein said step of annealing said thin copper film at a temperature in a range of 350 to 450° C. results in the production of $TaF_5$, the process further comprising the step of removing said $TaF_5$ from said deposition chamber.

21. The process of claim 16 wherein said step of annealing said thin copper film at a temperature in a range of 350 to 450° C. is conducted in said deposition chamber without adding an annealing gas to the deposition chamber.

* * * * *